United States Patent [19]

Shiau et al.

[11] Patent Number: 5,699,298
[45] Date of Patent: Dec. 16, 1997

[54] FLASH MEMORY ERASE WITH CONTROLLED BAND-TO-BAND TUNNELING CURRENT

[75] Inventors: Tzeng-Huei Shiau, Hsin-Pu, Taiwan;
Ray-Lin Wan, Fremont, Calif.;
Yuan-Chang Liu, Miao-Li, Taiwan;
Chun-Hsiung Hung, Hsinchu, Taiwan;
Weitong Chuang, Taichung, Taiwan;
Han Sung Chen, Keelung, Taiwan;
Fuchia Shone, Hsinchu, Taiwan

[73] Assignee: Macronix International Co., Ltd., Hsinchu, Taiwan

[21] Appl. No.: 718,525

[22] PCT Filed: May 22, 1996

[86] PCT No.: PCT/US96/07490

§ 371 Date: Oct. 7, 1996

§ 102(e) Date: Oct. 7, 1996

[51] Int. Cl.$^6$ .................................. G11C 16/00
[52] U.S. Cl. ................. 365/185.18; 365/185.22; 365/185.24; 365/185.33
[58] Field of Search ............... 365/185.18, 185.22, 365/185.24, 185.29, 185.33, 201

[56] References Cited

U.S. PATENT DOCUMENTS

| | | | |
|---|---|---|---|
| 4,996,571 | 2/1991 | Kume et al. | 365/218 |
| 5,297,096 | 3/1994 | Terada et al. | 365/218 |
| 5,337,281 | 8/1994 | Kobayashi et al. | 365/218 |
| 5,347,490 | 9/1994 | Terada et al. | 365/185.06 |
| 5,359,554 | 10/1994 | Odake et al. | 365/184 |
| 5,369,615 | 11/1994 | Harari et al. | 365/185.22 |
| 5,399,891 | 3/1995 | Yiu et al. | 257/316 |
| 5,400,286 | 3/1995 | Chu et al. | 365/185.22 |
| 5,416,738 | 5/1995 | Shrivastava | 365/185.24 |
| 5,424,993 | 6/1995 | Lee et al. | 365/218 |
| 5,444,655 | 8/1995 | Yoshikawa | 365/185.23 |
| 5,463,586 | 10/1995 | Chao et al. | 365/210 |
| 5,485,423 | 1/1996 | Tang et al. | 365/185.19 |
| 5,488,245 | 1/1996 | Shimizu et al. | 257/316 |
| 5,528,546 | 6/1996 | Chao et al. | 365/185.22 |
| 5,557,570 | 9/1996 | Iwahashi | 365/185.29 |
| 5,561,631 | 10/1996 | Curd | 365/185.29 |
| 5,568,419 | 10/1996 | Atsumi et al. | 365/185.3 |
| 5,615,154 | 3/1997 | Yamada | 365/185.22 |

OTHER PUBLICATIONS

Ajika, et al., "A 5 Volt Only 16M Bit Flash EEPROM Cell with a Simple Stacked Gate Structure", IEEE International Electron Devices Meeting, pp. 115–118, Dec. 1990.

Wann, et al., "Suppressing Flash EEPROM Erase Leakage with Negative Gate Bias and LDD Erase Junction", IEEE Symposium on VLSI Technology, pp. 81–82, May 1993.

*Primary Examiner*—Tan T. Nguyen
*Attorney, Agent, or Firm*—Wilson Sonsini Goodrich & Rosati

[57] ABSTRACT

Substantial reduction in peak current encountered during an erase process for a flash memory device is achieved by selection of source voltage potential during the erase according to the expected band-to-band tunneling current encountered during the process. During the beginning of the process, a lower source voltage potential is selected, which is high enough to cause significant erasing while suppressing band-to-band tunneling current in a portion of the array, and during a second part of the erasing process, a higher source potential is utilized, which ensures successful erasing of the array, without exceeding the peak current requirements of the power supply used with the device. The first and second parts of the erase sequence will induce band-to-band tunneling current in addition to Fowler-Nordheim tunneling current. The band-to-band tunneling current is characterized by a turn on threshold source potential which is inversely related to the threshold of the cell receiving the voltage sequence. The source voltage used in the first part of the erase sequence is set at level that is near or above the turn on threshold source potential for higher threshold cells that are in the high threshold state, but less than the turn on threshold source potential for lower threshold cells in the high threshold state. The source potential in the second part is set at level which is near or above the turn on threshold source potential for lower threshold cells in the high threshold state.

28 Claims, 8 Drawing Sheets

FLASH MEMORY ERASE WITH CONTROLLED BAND-TO-BAND TUNNELING CURRENT

BACKGROUND OF THE INVENTION

1. Field of the Invention

This invention relates to floating gate memory devices, such as flash memory, and in particular to methods and circuits for erasing arrays of floating gate memory cells with reduced peak current consumption.

2. Description of Related Art

Non-volatile memory based on integrated circuit technology represents an expanding field. Several popular classes of non-volatile memory are based on arrays of floating gate memory transistors which are electrically erasable and programmable.

The act of programming a memory array of floating gate memory transistors in one common approach involves injecting the floating gates of addressed cells with electrons, which causes a negative charge to accumulate in the floating gate and the turn-on threshold of the memory cell to increase to a high threshold state. Thus, when programmed, the cells will not turn on, that is, they will remain non-conductive, when addressed with read potentials applied to the control gates. The act of erasing a cell having a negatively charged floating gate involves removing electrons from the floating gate to lower the threshold. With the lower threshold, the cell will turn on to a conductive state when addressed with a read potential to the control gate. For an opposite polarity array, programming involves selectively removing electrons from the addressed cells' floating gates.

During the erase process in flash memory devices, an erasing potential is applied in parallel to the entire array, or to large sectors of the array. Thus, the power supply used during the erasing procedure must be capable of handling the current required for the erase process in large number of cells in parallel. The primary current in the erase process is so called Fowler-Nordheim (F-N) tunneling current by which electrons are driven from the floating gate into the source of the floating gate memory cell. Another source of current during the erasing procedure is known as band-to-band tunneling. Band-to-band tunneling results in current into the substrate, and current in the form of unwanted holes injected in the direction of the floating gate. Most of these unwanted holes stay in an area about 15–30 Angstroms away from the surface of the silicon. Because threshold voltage of the cell is based on the sum of the charges at the floating gate (electrons for example), and the charges in the area between the floating gate and the silicon surface (trapped holes, for example), and these holes can easily de-trap and change the sum of charge, the reliability of the cells is reduced. See, for example, Ajika et al., "A Five Volt Only 16M Bit Flash EEPROM Cell With a Simple Stacked Gate Structure", IEDM 1990, page 115–118; and Wann, et al., "Suppressing Flash EEPROM Erase Leakage with Negative Gate Bias and LDD Erase Junction", Symposium on VLSI Technology 1993, pages 81–82. As described in Wann, et al., use of a negative gate potential during the erase process, allows use of a lower source voltage. The lower source voltage suppresses avalanche breakdown and improves endurance and reliability of the cell. However, unwanted band-to band tunneling current is not reduced for a given erase speed in Wann, et al. According to Wann, et al., to further suppress the band-to-band tunneling, erase speed is sacrificed.

Band-to-band tunneling current is related to the threshold of the cell being erased. Thus, a problem arises in flash memory devices, because cells in the high threshold state do not all have the same threshold. Therefore, many cells in the high threshold state will have a higher threshold level than others. For example, some cells may have a threshold of 8 volts, while others may have a threshold of 6 volts. The band-to-band tunneling current generated in the higher threshold cells (e.g. near 8 volts) is greater than that in the lower threshold cells (e.g. near 6 volts). Therefore, higher threshold cells create significant band-to-band tunneling current during an erase process. Because the flash erase procedure involves erasing a sector of the entire array in parallel, a significant peak current can occur. This increases the cost of power supplies or restricts the range of available power supplies which can be used for flash memory devices.

Prior art systems have been implemented in which a resistor is placed in series between the power supply and the source terminals, as a current limiter to reduce the bias at high currents, and thereby reduce band-to-band tunneling current. However, this approach has not successfully controlled peak current during the initial erase pulse.

Accordingly, it is desirable to provide a technique which allows for maintaining significant erasing speed in a flash memory device, while controlling the peak currents generated during the erase process.

SUMMARY OF THE INVENTION

The present invention provides substantial reduction in peak current encountered during an erase process for a flash memory device by selection of source voltage potentials during the erase according to the expected band-to-band tunneling current encountered during the process. During the beginning of the process, a lower source voltage potential is selected, which is high enough to cause significant F-N tunneling current while suppressing band-to-band tunneling current, and during a second part of the erasing process, a higher source potential is utilized, which ensures successful erasing of the array, without exceeding the peak current requirements of the power supply used with the device.

Thus, the present invention can be characterized as a floating gate memory integrated circuit based on a set of floating gate memory cells arranged in rows and columns. The cells have a high threshold state in which cells are not conductive in response to a read potential applied to control gate terminals of the cells, and a low threshold state in which the cells are conductive in response to the read potential applied to the control gate terminals. The cells in the high threshold state have a distribution of thresholds above the read potential. For example, with a read potential of 5 volts, the range of thresholds of cells in the high threshold state may vary from about 6 volts to about 8 volts. The set of floating gate memory cells includes a plurality of drain lines coupled to the drain terminals of columns of cells in the set, a plurality of source lines coupled to source terminals of respective columns in the set, and a plurality of word lines coupled to the control gate terminals of respective rows of cells. A control circuit is coupled to the pluralities of drain lines, source lines and word lines, for setting in parallel the cells in the set of cells that are in the high threshold state to a low threshold state. The control circuit includes voltage supply circuits which supply a first voltage sequence to lower the thresholds of cells in the set by Fowler-Nordheim tunneling. The first voltage sequence includes applying a negative potential to the plurality word lines, and applying a first positive potential to the plurality of source lines while the drain lines are in an open circuit state. This results in lowering the thresholds of the cells. Next, the thresholds of the cells in the set are tested to determine whether they have been successfully erased. If all the cells are not in the low threshold state, then the first voltage sequence and the testing are retried until all the cells are in the low threshold state, or until a number M of retries has been executed. If any of the cells are not in the low threshold state after the number M of retries of the first voltage sequence, then the supply circuits supply a second voltage sequence to lower the thresholds of cells in the set by Fowler-Nordheim tunneling. The second voltage sequence includes applying a negative potential to the plurality word lines and applying a second positive potential to the plurality of source lines, and then testing the thresholds of the cells. If all the cells are not in the low threshold state, then the second voltage sequence is retried until all of the cells are in the low threshold state, or until a maximum number of retries has been executed.

As discussed above, the first and second voltage sequences induce band-to-band tunneling current in addition to Fowler-Nordheim tunneling current. The band-to-band tunneling current is characterized by a turn on threshold source potential which is inversely related to the threshold of the cell receiving the voltage sequence. That is, the turn on threshold source potential is lower for cells having a high threshold, than it is for cells having a lower threshold. According to the present invention, the first positive voltage used in the first voltage sequence is set at a level that is near or above the turn on threshold source potential for higher threshold cells that are in the high threshold state, but less than the turn on threshold source potential for lower threshold cells in the high threshold state. The second positive potential which is used in the second voltage sequence is set a level which is near or above the turn on threshold source potential for lower threshold cells in the high threshold state. This way, the band-to-band tunneling current is controlled in the first voltage sequence in the presence of higher threshold cells, and the threshold in the higher threshold cells is lowered, before the second voltage sequence is applied. This limits the peak current consumption used in the erase process, without a counterbalancing reduction in speed of the erase process. This technique can also be applied to a sectored array system, in which sectors of the array to be erased in parallel are identified by sector erase flags. According to this embodiment, only sectors having a set sector erase flag are subject to the first and second voltage sequences.

Furthermore, the present invention can be extended to include a "soft program" repair pulse being applied to the erased cells. The first and second voltage sequences, results in some cells having thresholds lowered below a selected limit of threshold voltages for the low threshold state. In this embodiment, voltage supply circuits supply a repair pulse to the selected sectors during a repair time interval across the sources and drains of the cells, while setting the voltage on the word lines of the selected cells below the selected limit of threshold voltages. The repair pulse has the effect of normalizing the threshold of the erased cells, and improving the reliability of the array.

According to another aspect of the invention, the control circuit used for the first and second voltage sequences sets the plurality of drain lines to an open circuit state during the first and second voltage sequences. According to yet another aspect of the invention, the negative potentials applied to word lines during the first and second voltage sequences are less than negative 6 volts, such as about −7.8 volts. The positive potential applied to the source during the first voltage sequence is less than 5 volts preferably between 4 and 5 volts, such as for example 4.5 volts. The positive potential applied during the second voltage sequence is between 5 and 6 volts, such as for example 5.5 volts.

The present invention can also be characterized for method for performing the first and second voltage sequences as discussed above in order to control the peak current generated during an erase process.

Accordingly, the present invention is based on applying a lower source bias during the initial part of the erase process, because the amount of charge is relatively high and band-to-band tunneling current is higher, during the initial erase interval. After the amount of charge has been reduced in the early erase period, the circuit then applies higher source bias to the flash memory cells to improve erase efficiency. Consequently, the current loading during the erase period does not cause peak current problems for the power supplies used with the system.

Other aspects and advantages of the present invention can be seen upon review of the figures, the detailed description and the claims which follow.

DETAILED DESCRIPTION

A detailed description of preferred embodiments of this invention is provided with reference to the figures. The improved embedded erase sequence of an array of floating gate memory cells arranged in blocks, according to the present invention results in reduced peak current by controlling band-to-band tunneling current.

Figure 1:
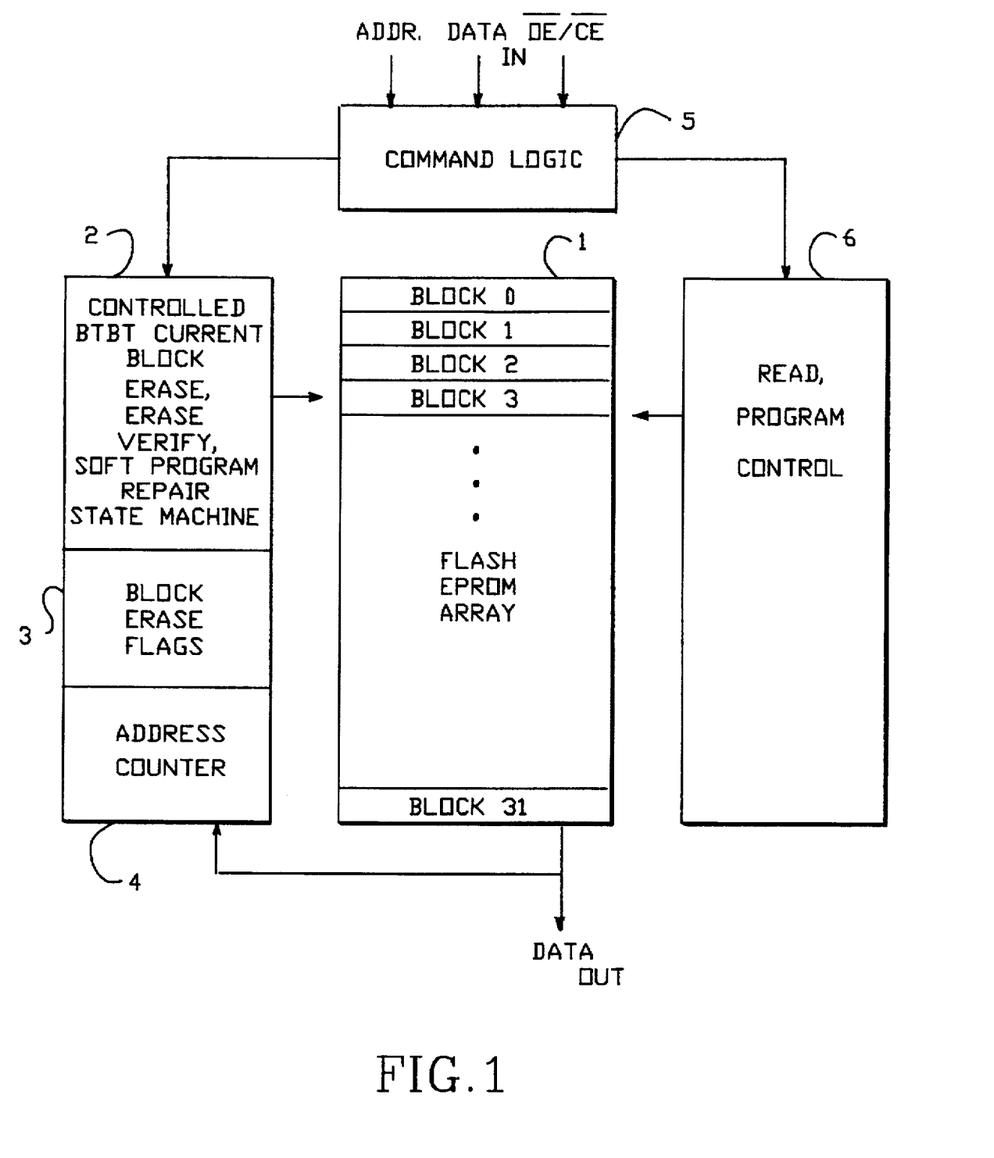
FIG. 1 is a schematic block diagram providing an overview of a flash memory integrated circuit according to the present invention.

FIG. 1 shows the basic structure of a 4 megabyte floating gate memory integrated circuit incorporating this invention. The circuit includes a memory array, generally 1, which is divided into a plurality of blocks (32 blocks in the figure). The segmentable architecture of the memory array allows application of the erase sequence of this invention to cell blocks individually, thus allowing block by block erasing. The array architecture is described in detail below with reference to FIG. 2.

Still referring to FIG. 1, coupled with the array 1 are a read and program control circuit, generally 6, and a block erase/erase verify/repair circuit, generally 2. The block erase/erase verify/repair circuit 2 is coupled to block erase flags 3 and includes circuits to control band-to-band tunneling current. An address counter 4 is included for incrementing through memory cells, blocks or the entire array for the erase/erase verify/repair sequence.

The chip includes command logic 5 which is coupled to the address, data, and other control lines such as the output enable and chip enable signals. The command logic 5 interprets inputs to set a mode of operation for the read and program control logic 6 and the block erase/erase verify/repair circuit 2.

Command logic 5 may be implemented as done in standard floating gate memory integrated circuits, such as Am28F020 flash memory chip manufactured by Advanced Micro Devices, Inc. of Sunnyvale, Calif. with additional commands of this invention for cell, block or array erase. In response to commands issued by the command logic 5, an embedded erase operation is executed by state machines in the erase/erase verify/repair circuit 2. The user, through a host CPU or otherwise, supplies address and data signals to the command logic 5 to indicate a preferred mode of operation. The modes executed by erase/erase verify/repair circuit 2 include a chip erase mode in which all blocks in the array 1 are to be erased and a block erase mode in which selected blocks in the array 1 are to be erased. In response to user input, blocks to be erased are identified by block or sector erase flags 3 stored on the chip.

Figure 2:
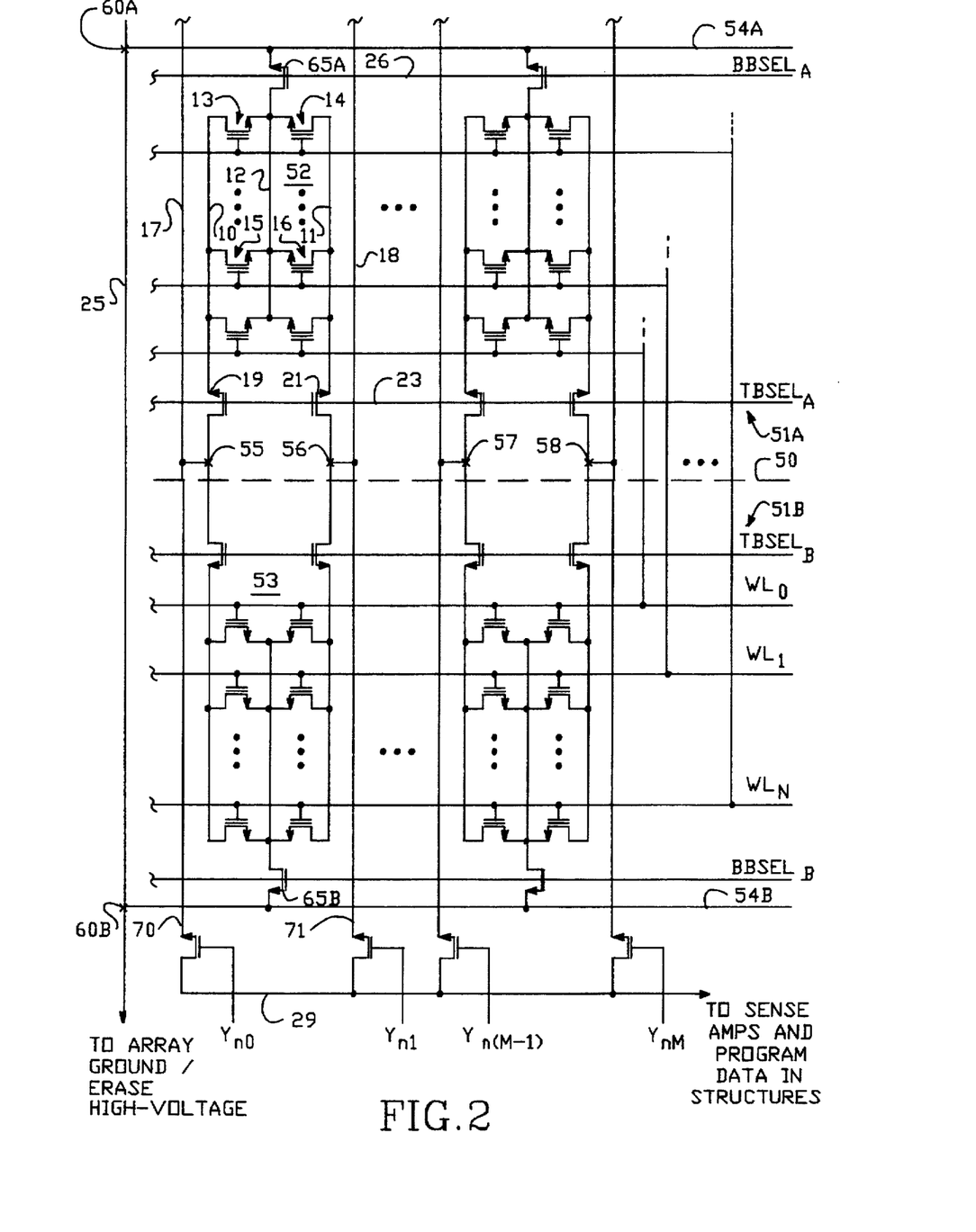
FIG. 2 is a circuit diagram showing a segmented array architecture for a floating gate memory cell device of FIG. 1.

FIG. 2 illustrates the details of a segmentable array architecture in a drain-source-drain configuration of the floating gate memory circuit in which this invention may be implemented, and like that described U.S. Pat. No. 5,399,891, entitled NON-VOLATILE MEMORY CELL AND ARRAY ARCHITECTURE, issued Mar. 21, 1995 which is incorporated by reference herein. Other array architectures may be used, as well.

The circuit includes a first local bit line 10 and a second local bit line 11 which are implemented by buried diffusion conductors. Also, included is a local virtual ground line 12 implemented by buried diffusion. A plurality of floating gate transistors having drains and sources coupled to the local bit lines 10, 11 and local virtual ground line 12.

The drains of the first column of transistors, generally 13, are coupled to the first local bit line 10, and the drains of the second column of transistors, generally 14, are coupled to the second local bit line 11. The gates of the floating gate transistors are coupled to word lines $WL_0$ through $WL_N$, where each word line (e.g., $WL_1$) is coupled to the gate of a transistor (e.g., transistor 15) in the first local bit line 10 and a transistor (e.g., transistor 16) in the second local bit line 11. The transistors 15 and 16 can be considered a two transistor cell with a shared source diffusion.

The act of charging the floating gate is called the program step for the floating gate memory cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the floating gate memory cell. This is accomplished through the F-N (Fowler-Nordheim) tunneling mechanism between the floating gate and the source (source erase) or between the floating gate and the substrate (channel erase). The source erasing is performed by applying a positive bias to the source, such as less than seven volts, while the gate is negatively biased, such as less than minus six volts. According to the present invention, the source potential is set at a specified lower value (e.g. 4.5 volts) during the first few erase retries, and at a specified higher value (e.g. 5.5 volts) during the remaining erase retries, as described in detail below.

Individual blocks of cells are controlled by select signals, that is, top block select signals $TBSEL_A$ and $TBSEL_B$ and bottom block select signals $BBSEL_A$ and $BBSEL_B$.

Still referring to FIG. 2, a first global bit line 17 and a second global bit line 18 are associated with each drain-source-drain block. The first global bit line 17 is coupled to the source of top block select transistor 19 through a metal-to-diffusion contact 55. Similarly, the second global bit line 18 is coupled to the source of top block select transistor 21 through a metal-to-diffusion contact 56. The drains of the top block select transistors 19, 21 are coupled to the first and second local bit lines 10 and 11, respectively. The gates of the top block selector transistors 19, 21 are thus controlled by a top block select signal $TBSEL_A$ on line 23.

In a similar manner, the gate of the bottom block select transistor 65A is controlled by a bottom block select signal $BBSEL_A$ across line 26. The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. In this architecture, the conductor 54A is a buried diffusion conductor which extends to a metal-to-diffusion contact 60A at a position displaced horizontally through the array, which provides contact to a vertical metal virtual ground bus 25.

For sense amps and program data in structures, a data line 29 is coupled to the global bit lines 17 and 18 which extend vertically through the array to respective column select transistors 70, 71. Thus, the source of column select transistor 70 is coupled to global bit line 17, the gate of column select transistor 70 is coupled to a column decode signal $Y_{n0}$, and the drain of the column select transistor 70 is coupled to data line conductor 29.

The blocks of floating gate memory cells as shown in FIG. 1 are configured into a plurality of subarrays as illustrated in FIG. 2 which illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bit line pair (e.g., 17, 18). As one proceeds up the bit line pair, the memory subarrays are flipped so as to share virtual ground conductors 54A, 54B (buried diffusion) and metal-to-metal diffusion contacts 55, 56, 57, 58. The virtual ground conductors 54A, 54B extend horizontally across the array to a vertical virtual ground metal line 25 through metal-to-diffusion contacts 60A, 60B. The subarrays repeat on opposite sides of the metal virtual ground line 25 so that adjacent subarrays share a metal virtual ground line 25. The metal virtual ground line 25 is coupled to array ground and erase high voltage circuitry. Thus, the subarray layout requires two metal contact pitches per column of two transistor cells for the global bit lines and one metal contact pitch for the metal ground line 25.

During a soft program pulse, driving the word line at slightly higher voltage creates a possibility that a higher current may be generated in the sector being soft programmed. This current is limited by a current limiter circuit on the source side of the cell. With reference to FIG. 2, the bottom block select transistor 65B or 65A acts as a current limiter. This transistor on its source side is connected to the array ground power supply, which is a generator to support zero volts or a positive voltage depending on the mode of operation. Thus bottom block select transistors 65A, 65B are sector decode transistors which also serve as current limiters during soft program. Other current limiting schemes, such as current mirror circuits, could be utilized as well.

The sector decode ability provided by the circuit of FIG. 2, allows the circuitry to be implemented which applies a drain disturb style soft program pulse only to selected segments of the array by applying about 5.5 volts to the local drain lines, while grounding the source.

Also, an alternative system will apply the soft program pulse of about 5.5 volts, or more depending on circuit parameters, through the source terminal of devices being soft programmed, while grounding the bit lines or drain terminals. The same segment-by-segment decoding, and word line drivers can be utilized in this source disturb approach.

Figure 3:
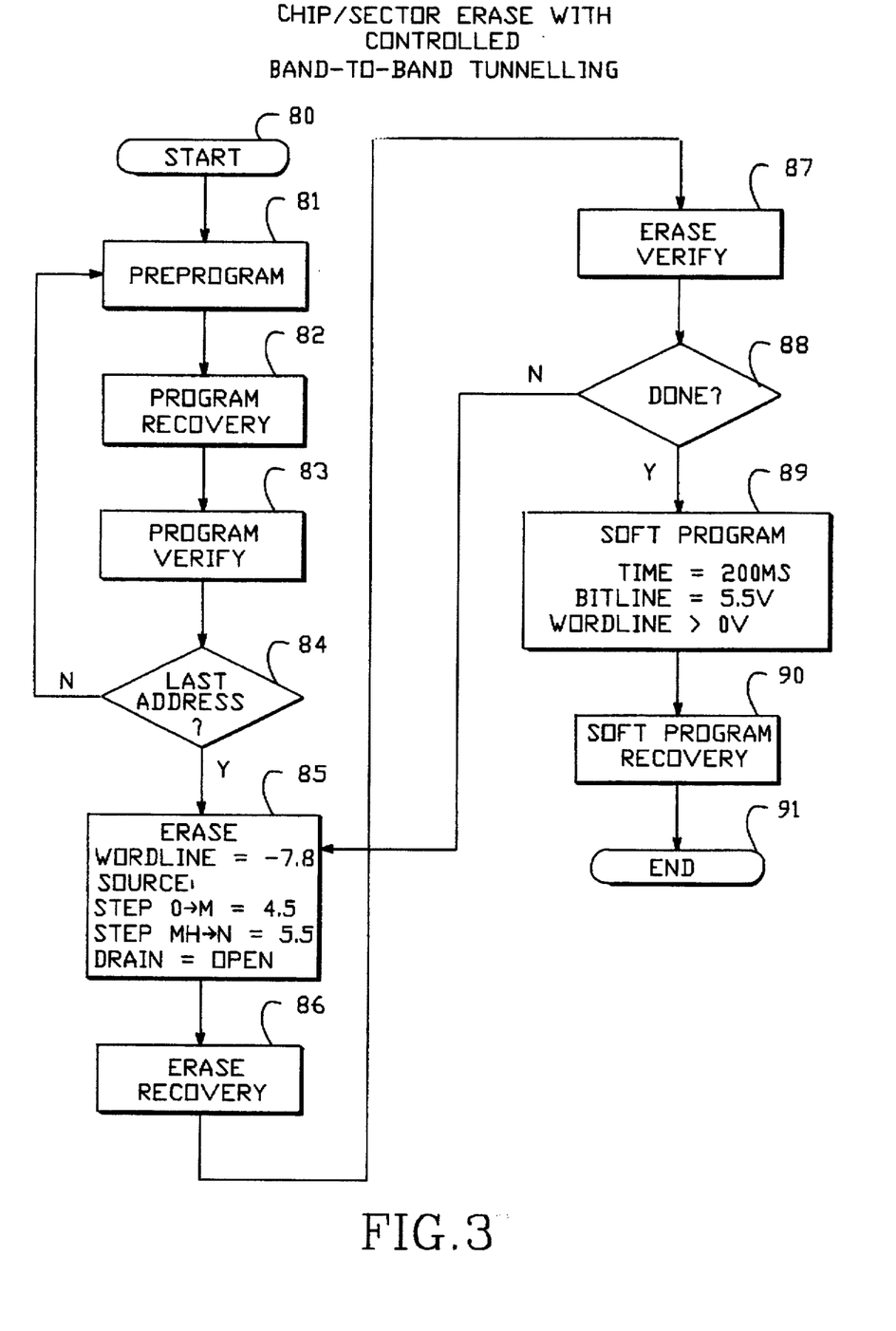
FIG. 3 is an overall flow chart executed by the state machine of FIG. 1, with controlled band-to-band tunneling current.

Referring to FIG. 3, an overall flow chart of a chip or block erase process, including the steps for limiting peak current of this invention, is shown. After starting the erase operation (step 80), pre-programming is initiated for the chip or block selected for erase, through an on chip state machine, a host CPU or otherwise through command logic 5 (step 81). At step 82, a program recovery period occurs allowing the voltage to settle out or stabilize after pre-programming. At step 83, a program verify process occurs. The system then checks to see if the last address in the chip or block has been pre-programmed (step 84). If not, the process starting at the pre-programming step is repeated until all cells in the chip or block have been pre-programmed.

After pre-programming, the erase operation at step 85 is executed which is followed by the erase recovery period 86 to allow the erase voltage to settle out. Next, an erase verify operation 87 is performed. Then, the system checks to see if the erase process is complete at step 88. If not, it returns to step 85, performing the erase operation until complete.

According to the present invention, the erase pulse applied at step 85 involves setting the word line to a negative potential, such as −7.8 volts, setting the drain to an open circuit state (floating), and setting the source potential to a positive potential. During the first M retries, the source potential is set at about 4.5 volts. During the remaining retries, source potential is set at about 5.5 volts. In one preferred of the present invention, the M is 3. The source potentials of 4.5 volts and 5.5 volts of the two erase voltage sequences, are selected according to the turn on source potential for band-to-band tunneling current of the floating gate memory cells in the array. The first source potential at about 4.5 volts is set a level at which only cells having a higher threshold, which are in the high threshold state, will encounter significant band-to-band tunneling current, while cells having a lower threshold in the high threshold state will not suffer significant band-to-band tunneling current. The higher source potential, at about 5.5 volts in this example, is set so that the lower threshold cells in the array may encounter significant band-to-band tunneling current. However, the second source potential at about 5.5 volts is not applied until the majority of the cells in the array have been reduced in threshold by the application of the first voltage sequence during the first M retries of the erase pulse. The determination of the preferred band-to-band tunneling current turn on source potentials for use according to the present invention is described in detail below in reference to FIG. 9.

When the erase sequence is complete at step 88, the soft program at step 89 is initiated in which the soft program pulse is applied to all cells in the entire chip or block subject of the erase operation in parallel. The soft program recovery occurs at step 90. The process ends at step 91.

Figure 4:
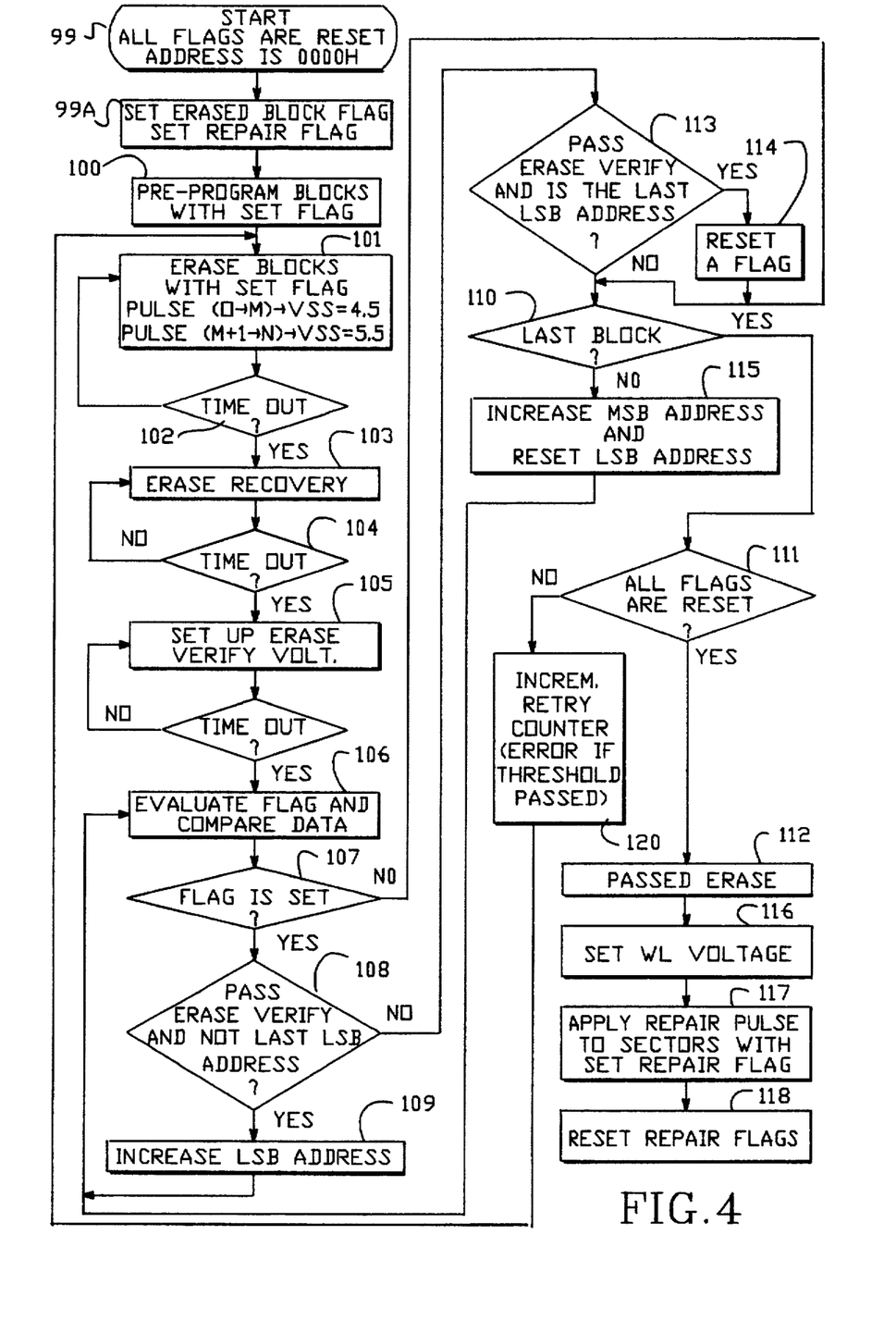
FIG. 4 is a more specific flow chart illustrating the sector erase and repair process of this invention.

FIG. 4 illustrates one embodiment of this invention including an algorithm for the embedded erase and repair process which is generally executed by the control circuit 2 using the sector erase flags 3 and address counter 4 of FIG. 1.

According to the embedded erase algorithm, an erase operation begins at step 99 with the setting of one or more flags indicating sectors of the array to be erased. For chip erase, all flags are set and the address counters are initialized to address zero. If a sector erase operation is to be executed, then only flags for selected sectors are set. According to this embodiment of the present invention, repair flags are also set, one for each sector erase flag, to identify sectors to receive the soft program repair pulse (step 99A). Next, a pre-program operation is executed on selected sectors (step 100).

In the next step, all the sectors having a set flag are erased (step 101). The erase step involves applying an erase pulse to the sectors having a set flag, which results in erasing the selected sectors of the array in parallel. During the first M retries of the erase pulse, the source potential is set to a first lower voltage, such as 4.5 volts in this example. During the remaining retries of the erase pulse, the source potential is set to a higher value, in this example about 5.5 volts. During the erase operations, the source voltages of the virtual ground line 25 are isolated from the unselected sectors by, for example, the BBSEL transistors. BBSEL is driven with high voltage to pass array source voltage when the sector flag is set, and with zero volts when the sector flag is reset. This allows a sectored erase operation. Then the entire set of selected sectors is erased by applying energizing voltages as described above, segmented under control of the bottom block select transistor.

Next, a timer waits for an erase timeout condition (step 102). After the timeout condition, an erase recovery phase is entered (step 103) Again, this recovery phase is timed as indicated at step 104.

After erase recovery, the erase verify voltages are set up (block 105). This operation is described in detail in U.S. Pat. No. 5,463,586 entitled ERASE AND PROGRAM VERIFICATION CIRCUIT FOR NON-VOLATILE MEMORY.

The next step is to evaluate the flag and test the data in each location inside the sectors having a set flag (block 106). This routine involves determining whether the flag is set (block 107). If it is set, the routine checks first for an erase verify pass and overflow of the least significant bit counter (block 108). If a pass is detected and the counter is not at the end of the sector, then the least significant bit address is incremented (block 109). At this point, the algorithm loops back to block 106.

If the flag is not set at block 107, then the algorithm loops to block 110 where it tests to determine whether the last sector has been tested. If the last sector has been tested at block 110, the algorithm proceeds to block 111, where it tests whether all flags have been reset. If all have been reset, or are in a reset state at the beginning of the routine, then the algorithm indicates that the erase is done (block 112). If all flags have not been reset, then the algorithm branches to block 120 to increment the retry counter. If the retry counter overflows (e.g. reaches 1024), then an error is signalled. If no overflow occurs, then the algorithm loops back to block 101 to re-erase sectors having a set flag.

If, at block 108, a cell did not pass erase verify, or passes but is the last LSB in the sector, then the algorithm branches to block 113. In block 113, the algorithm again tests for erase verify pass and the end of the sector. If the cell is at the end of the sector and passes, then the erase flag for the sector is reset (block 114). If the cell is not at the end of the sector, the erase flag for the sector is not reset at this time, then the MSB address is incremented to go the next sector, and the LSB address is reset (block 115). At that point, the algorithm loops back to block 106 to loop through other sectors having a set flag for erase verify.

After erase verify, the soft program repair pulse is applied to sectors having a set repair flag. Thus, the word line voltage is initially set at ground or above, preferably at approximately 0.3 volts (step 116), but may be more or less. In this embodiment, that word line voltage is maintained while the repair pulse is applied for approximately 200 ms to the bit line to sectors having set repair flags (step 117). Finally, the repair flags are reset without a repair verify operation (step 118). During the repair pulse, top block select transistors of selected sectors are enabled in response to the repair flags, so that a repair voltage of 5.5 volts is applied to the buried drain lines to repair those over-erased cells which reside in the selected sectors (sector erase case) or the whole chip (chip erase case). The repair pulse may range, for example from about 3.5 volts to about 10.0 volts depending on the channel length and other cell parameters, on the repair pulse length, and on other factors.

FIGS. 5–8 provide logic in circuit diagrams used for implementing the two erase voltage sequences according to the present invention. It can be seen in FIG. 5, the simplified diagram of the device is shown. The device includes a flash array 500 which receives a source voltage potential ARVSS on line 501 at the source of transistor 502. The drain of transistor 502 is connected to the high programming potential $V_{PP}$ (e.g. 12 volts ±5%, rated at 50 mA). The gate of transistor 502 is connected to the BIAS voltage on line 504 generated by the bias circuit 503. The bias circuit 503 is controlled by control signal PERVF on line 505 generated by the state machine 506 on the device which controls embedded erase algorithm. As mentioned above, during the first M retries of the erase pulse, the control signal PERVF on line 505 is set to a logic high potential, about 5 volts. During retries M+1 through N the control signal PERVF is set to a logic low potential, 0 volt. Normally, according to the present invention, the parameter M ranges from 1 to 5, and the parameter N is about 1024. Of course, the integers M and N can be adapted as suits the needs of a particular implementation of the present invention.

Figure 5:
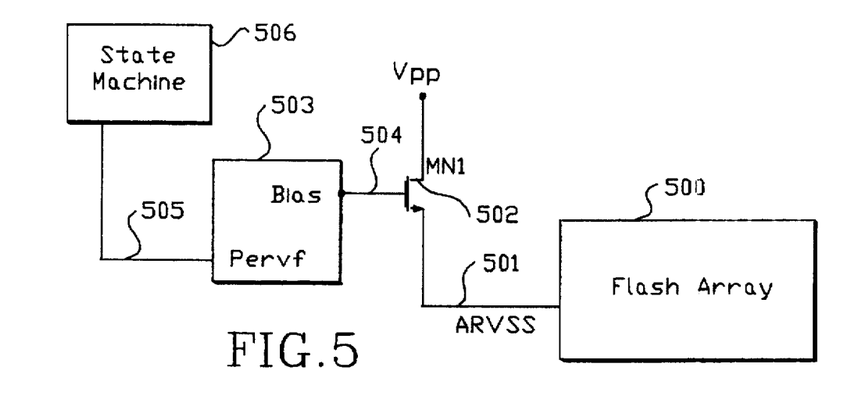
FIG. 5 is a simplified block diagram illustrating the circuits used for controlling the source voltage during the erase process according to the present invention.
Figure 6:
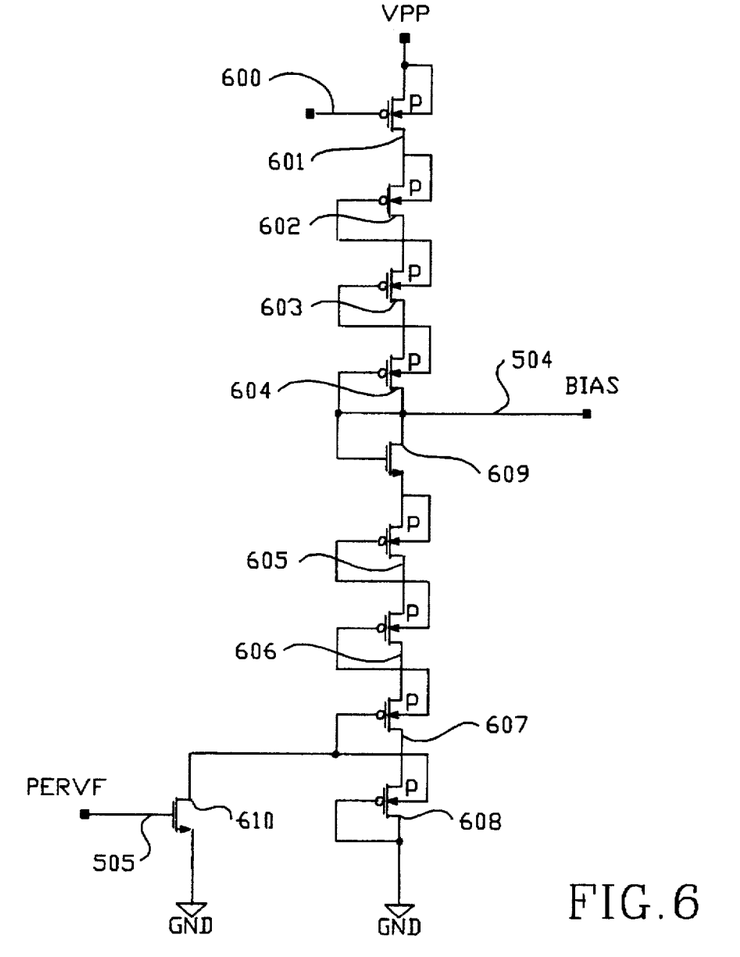
FIG. 6 is a circuit diagram of a voltage divider used to generate the BIAS signal of FIG. 5.

FIG. 6 illustrates one example voltage divider circuit for generation of the BIAS signal on line 504, by the circuit 503 of FIG. 5. The circuit of FIG. 6 receives as input PEKVF signal on line 505 from the state machine, and generates the BIAS signal on line 504. A second input to the BIAS circuit is supplied on line 600. This signal is 0 volt during the erase pulse, enabling the BIAS circuit, and is a high potential (e.g. 12 volts) when the erase pulse is not being generated. The BIAS circuit, according the embodiment of FIG. 6 includes p-channel transistors 601–608. Also, n-channel transistors 609–610 are included in the circuit. The p-channel transistors 601–604 are connected in series between the node 504 at which the BIAS signal is generated, and the programming potential $V_{PP}$. The gate of transistor 601 is coupled to the control signal on line 600. The gates of transistors 602–604 are coupled to their respective drains. Also, the well of each of the p-channel transistors in the circuit is coupled to its source.

The n-channel transistor 609 has its drain coupled to the node 504, and its source coupled to the source of p-channel transistor 605. The gate of transistor 609 is coupled to node 504. P-channel transistors 605–608 are coupled in series between the source of transistor 609, and ground. The gate of each of the p-channel transistors 605–608 is coupled to the respective drain. The source of each of the p-channel transistors 605–608 is coupled to the well in which the transistor is formed. N-channel transistor 610 has its drain coupled to the gate of p-channel transistor 607 and its source coupled to ground. The gate of transistor 610 receives the control signal PEKVF. In operation, the control signal PERVF is 5 volts during pulses 1 to M, and is 0 volt during the remaining pulses. The $V_{PP}$ equal to about 12 volts, the BIAS potential during the first erase pulse sequence is about 5.97 volts in this example. During the remaining erase pulse sequences, the BIAS potential is about 6.8 volts.

Figure 7:
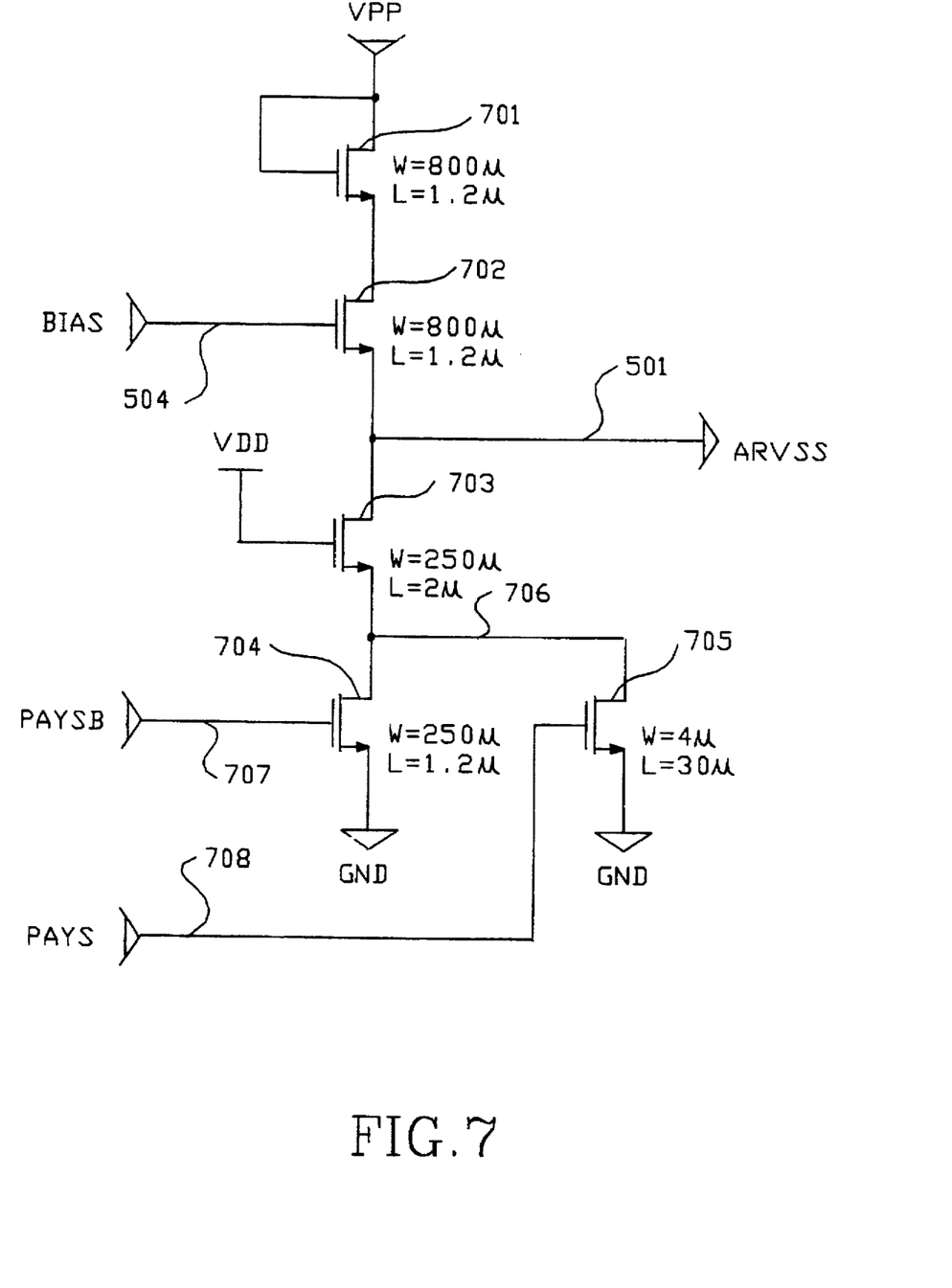
FIG. 7 is a circuit diagram of the source potential supply circuit used in the system of FIG. 5.

The BIAS signal on line 504 is used by the circuit of FIG. 7 to generate array source voltage ARVSS on line 501. The circuit in FIG. 7 which generates the source potential includes n-channel transistors 701,702, 703, 704 and 705. N-channel transistor 701 has its drain and gate coupled to the programming potential $V_{PP}$, and its source coupled to the drain of n-channel transistor 702. The gate of transistor 702 is connected to receive the BIAS signal on line 504. The source of transistor 702 is coupled to node 501 at which the source voltage potential ARVSS is supplied. Transistor 703 has its drain coupled to node 501, its gate coupled to the $V_{DD}$ potential (5 volts plus or minus 10%), and its source coupled to node 706. Transistor 704 has its drain coupled to node 706, and its source connected to ground. The gate of transistor 704 is connected on line 707 to the control signal PAYSB. Transistor 705 has its drain connected to node 706, and its source connected to ground. The gate of transistor 705 is connected to the control signal PAYS on line 708. In the example circuit shown in FIG. 7, transistors 701 and 702 are each 800 microns wide by 1.2 microns long. Transistors 703 and 704 are each 250 microns wide. Transistor 703 is 2 microns long. Transistor 704 is 1.2 microns long. Transistor 705 is 4 microns wide by 30 microns long. Transistor 705 provides a weak leakage path which prevents the node 501 from floating high during the erase process. In operation, the signal PAYSB is equal to 0 and the signal BIAS is equal to about 5.97 volts for the first set of erase pulses. This results in a source potential ARVSS of about 4.5 volts. During the remaining or second set of erase pulses, the control signal PAYSB is 0 volt, and the control signal PAYS is a logic one. During the second set of erase pulses, the BIAS signal is about 6.8 volts which results in source potential on line 501 of about 5.5 volts. At other times during the erase sequence, the signal PAYSB is at a logic one, the signal PAYS is at logic zero, and the BIAS signal is at 0 volt. This results in a source potential of about 0 volt.

Thus, according to the present invention, the embedded erase process involves a first voltage sequence in which the first M erase pulses have a source potential set at a first potential, and a second voltage sequence in which the remaining erase pulses have a source potential set at a second potential. The first potential is less than the second potential in order to control the amount of band-to-band tunneling current encountered during the initial part of the erase sequence, and thereby control peak current generated by the process to levels below the rated power supply levels. For example, a standard $V_{PP}$ power supplies 12 volts plus or minus 5 percent, with a rated maximum current of about 50 milliamps. Thus, it is necessary to control the current generated during the erase process, so that the peak current does not exceed 50 milliamps at a 12.6 volt supply. However, it is desirable that the erase process proceed as quickly as possible. Therefore, initial erase pulses should utilize as much as possible of the available peak current capacity of the power supply, without sacrificing erase speed.

Figure 8:
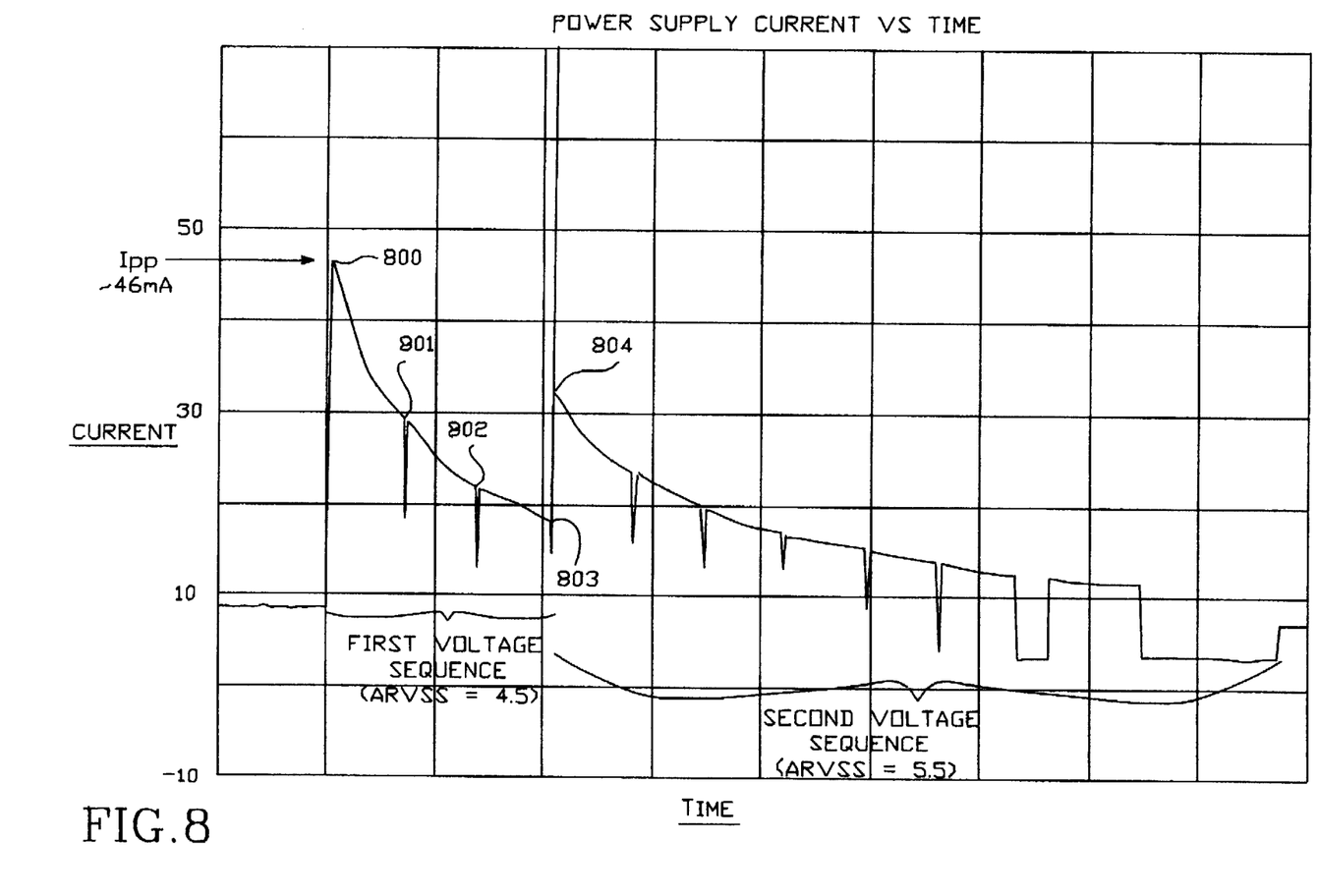
FIG. 8 is a graph illustrating the savings in peak current generation according to the present invention.

FIG. 8 illustrates the result of the process according to the present invention according to one example system. The example FIG. 8, a four megabit flash memory device having the architecture of FIGS. 1 and 2 was erased using the embedded erase algorithm of the present invention, where the first three erase pulses used a source potential of 4.5 volts, and the remaining erase pulses used a source potential of 5.5 volts. As can be seen, during the first erase pulse, the peak current $I_{PP}$ at point 800 is about 46 milliamps. During the first erase pulse, the current drops quickly, to a point 801. After point 801, a verify sequence is executed. At the end of the second erase pulse, the current is slightly more than 20 milliamps at point 802. At the end of the third erase pulse, the current is about 18 milliamps at point 803. At this point, the second voltage sequence begins, with the source potential at about 5.5 volts. Thus, the peak current at the beginning of the fourth pulse is about 33 milliamps at point 804. The current drops for each succeeding erase pulse to lower levels. The erasing speed is significantly increased by increasing the source potential from 4.5 to 5.5 volts during the fourth erase pulse without exceeding the peak current of the 50 milliamps for the power supply. Furthermore, the speed of the erase process is maintained, by applying an erase pulse which uses the maximum current driving capability of the power supply during the initial erase pulses, and maximizes the erasing electric fields during the remaining pulses.

Figure 9:
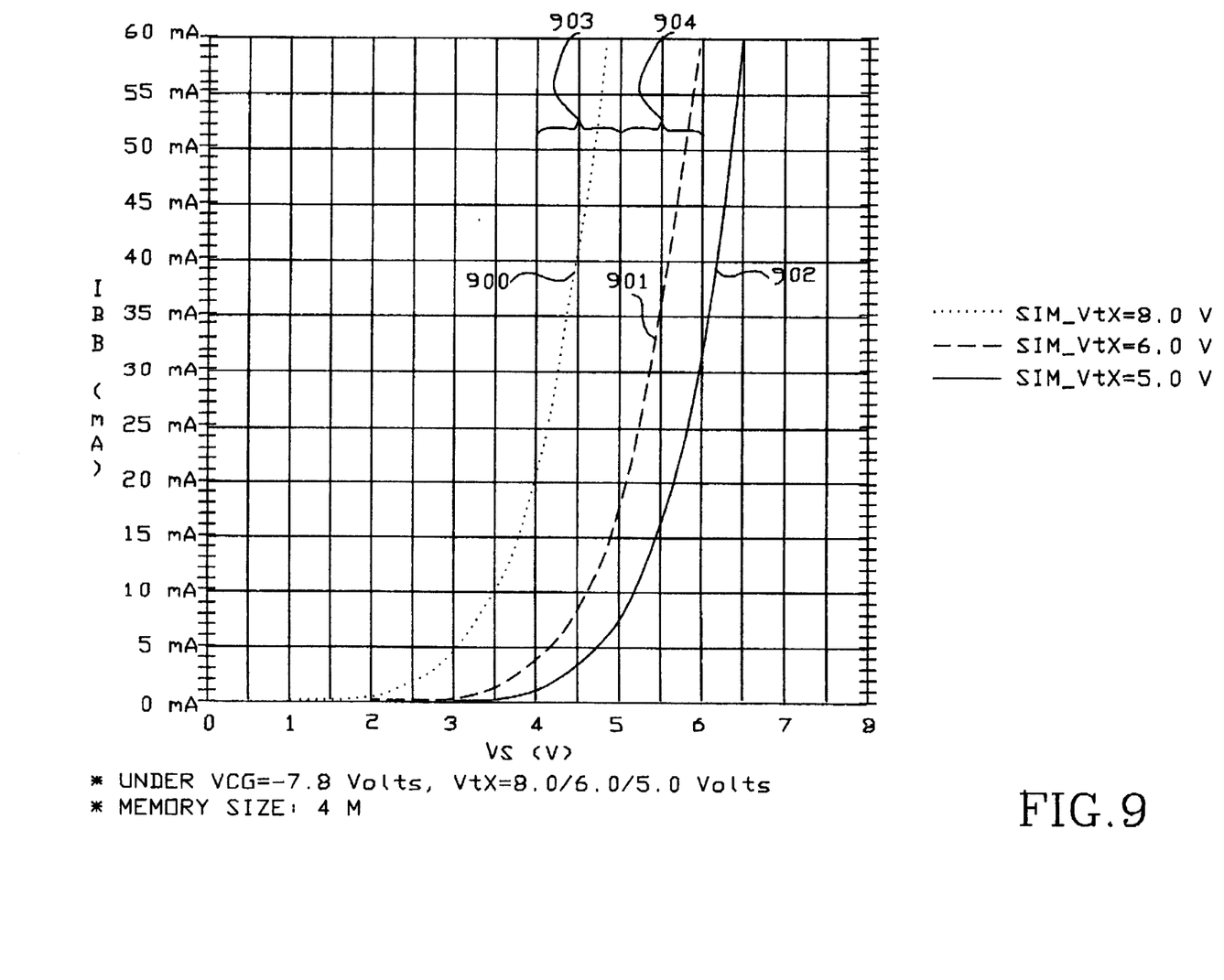
FIG. 9 is a graph illustrating the band-to-band tunneling current turn on source potentials.

The choice of the source potentials used in the voltage sequences of the erase algorithm according to the present invention can be understood in reference to FIG. 9. FIG. 9 is a graph of simulated band-to-band tunneling current for a four megabit array with a control gate potential of -7.8 volts, and the drain left at an open circuit state. The graph shows a first trace 900 for a simulated array with threshold voltage of the cells at 8 volts. A second trace 901 where the threshold voltage of the cells in the array is 6 volts, and a third trace 902 where the voltage threshold is 5 volts. According to the present invention, the source potential selected during the first voltage sequence of the erase algorithm is near the turn on threshold for band-to-band tunneling current of cells having a higher threshold, such as about 8 volts. Only higher threshold cells in the high threshold state generate significant band-to-band tunneling current, while lower threshold cells in the array do not generate significant band-to-band tunneling current with a source potential in the range of 4 to 5 volts in the interval 903. Thus, the first voltage at the source during the embedded erase algorithm is selected in the interval 903. The source voltage used in the second voltage sequence of the erase algorithm is selected near the turn on potential for cells having a lower threshold in the high threshold state, such as threshold of 6 volts. Thus, the second potential used in the second voltage sequence of the erase algorithm falls within the interval 904, between 5 and 6 volts. Thus, voltage levels of 4.5 volts and 5.5 volts were selected for the embedded erase algorithm first and second sequences according to this embodiment of the present invention.

The embedded erase sequence according to the present invention, thus includes a first voltage sequence in which higher threshold cells are driven to a lower level high threshold state, before the band-to-band tunneling current turn on threshold source potential is increased to interval 904. In this manner, the peak current consumed in the erase process for the initial pulse is significantly reduced, without a counter balancing reduction in erase speed, because the second voltage sequence involves increasing source potential to the region 904, where increased Fowler-Nordheim tunneling current can be achieved without unreasonable increase in band-to-band tunneling current.

In conclusion, the present invention reduces the high programming potential $V_{PP}$ power supply peak current requirements for an embedded erase algorithm in a large scale flash memory device. The technique involves controlling the mount of band-to-band tunneling current induced during erase pulses in a first erase voltage sequence, in order to prevent high peak currents. When combined with techniques to prevent over erase, such as the use of the sector flag scheme and the soft program pulses, as described herein, the present invention provides a flash memory device with high reliability, and controlled peak currents.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A floating gate memory integrated circuit, comprising:
   a set of floating gate memory cells arranged in a plurality of rows and columns, said cells having a high threshold state in which cells are not conductive in response to a read potential applied to control gate terminals, and a low threshold state in which cells are conductive in response to the read potential applied to the control gate terminals;
   a plurality of drain lines coupled to drain terminals of respective columns of cells in the set;
   a plurality of source lines coupled to source terminals of respective columns of cells in the set;
   a plurality of word lines coupled to control gate terminals of respective rows of cells in the set;
   a control circuit, coupled to the pluralities of drain lines, source lines and word lines, for setting the cells in the set in the high threshold state in parallel to the low threshold state, including voltage supply circuits to
       supply a first voltage sequence to lower the thresholds of cells in the set by Fowler-Nordheim tunneling, the first voltage sequence including applying a negative potential to the plurality of word lines, and applying a first positive potential to the plurality of source lines, then testing the thresholds of the cells, and if all the cells are not in the low threshold state, and if a number M of times the first voltage sequence has been tried does not equal a retry limit, then retrying the first voltage sequence and the testing until all the cells are in the low threshold state, where M is greater than or equal to one, and
       if any of the cells are not in the low threshold state after the number M of retries of the first voltage sequence, supply a second voltage sequence to lower the thresholds of cells in the set by Fowler-Nordheim tunneling, the second voltage sequence including applying a negative potential to the plurality of word lines, and applying a second positive potential to the plurality of source lines, then testing the thresholds of the cells, and if all the cells are not in the low threshold state, retrying the second voltage sequence and the testing until all the cells are in the low threshold state, or at least until a number of retries has been executed;

wherein the first and second voltage sequences induce band-to-band tunneling current in addition to Fowler-Nordheim maneling current, said band-to-band tunneling current characterized by a turn on threshold source potential which is inversely related to the threshold of the cell receiving said first or second voltage sequence, and said first positive voltage is set at a level which is near or above the turn on threshold source potential for higher threshold cells in the high threshold state, and less than the turn on threshold source potential for lower threshold cells in the high threshold state, and the second positive potential is set at level which is near or above the turn on threshold source potential for lower threshold cells in the high threshold state, so that band-to-band tunneling current is controlled in said first voltage sequence in the presence of higher threshold cells in the high threshold state, and the higher threshold cells in the high threshold state are lowered in threshold before said second voltage sequence to limit peak current consumption.

2. The floating gate memory integrated circuit of claim 1, wherein said first positive potential is less than 5 volts, and said second positive potential is less than 7 volts.

3. The floating gate memory integrated circuit of claim 2, wherein said negative potential in said first voltage sequence is less than negative 6 volts.

4. The floating gate memory integrated circuit of claim 2, wherein said negative potentials in said first voltage sequence and in said second voltage sequence are less than negative 6 volts.

5. The floating gate memory integrated circuit of claim 1, wherein said first positive potential is between 4 and 5 volts, and said second positive potential is between 5 and 6 volts.

6. The floating gate memory integrated circuit of claim 5, wherein said negative potentials in said first voltage sequence and in said second voltage sequence are less than negative 7 volts.

7. The floating gate memory integrated circuit of claim 1, wherein said set of cells includes more than 250 thousand cells.

8. The floating gate memory integrated circuit of claim 1, wherein said set of cells includes more than 4 million cells.

9. The floating gate integrated circuit of claim 1, wherein said control circuit sets the plurality of drain lines to an open circuit state in said first and second voltage sequences.

10. A floating gate memory integrated circuit, comprising:

an array of floating gate memory cells arranged in a plurality of rows and columns including a plurality of sectors, said cells having a high threshold state in which cells are not conductive in response to a read potential applied to control gate terminals, and a low threshold state in which cells are conductive in response to the read potential applied to the control gate terminals, and in which each sector includes a plurality of drain lines coupled to drain terminals of respective columns of cells in the sector;

a plurality of source lines coupled to source terminals of respective columns of cells in the sector; and a plurality of word lines coupled to control gate terminals of respective rows of cells in the sector;

a plurality of sector flags indicating sectors of the array to be erased in response to input signals;

a first control circuit, coupled to the pluralities of sector flags, drain lines, source lines and word lines, for setting the cells in selected sectors having set sector flags in the high threshold state in parallel to the low threshold state, including voltage supply circuits to supply a first voltage sequence to lower the thresholds of cells in the selected sectors by Fowler-Nordheim tunneling, the first voltage sequence including applying a negative potential to the plurality of word lines, and applying a first positive potential to the plurality of source lines, then testing the thresholds of the cells, and if all the cells are not in the low threshold state, and if a number M of times the first voltage sequence has been tried does not equal a retry limit, then retrying the first voltage sequence and the testing until all the cells are in the low threshold state, where M is greater than or equal to one, if any of the cells are not in the low threshold state after the number M of retries of the first voltage sequence, supply a second voltage sequence to lower the thresholds of cells in the selected sectors by Fowler-Nordheim tunneling, the second voltage sequence including applying a negative potential to the plurality of word lines, and applying a second positive potential to the plurality of source lines, then testing the thresholds of the cells, and if all the cells are not in the low threshold state, retrying the second voltage sequence and the testing until all the cells are in the low threshold state, or at least until a number of retries has been executed;

wherein the first and second voltage sequences induce band-to-band tunneling current in addition to Fowler-Nordheim tunneling current, said band-to-band tunneling current characterized by a turn on threshold source potential which is inversely related to the threshold of the cell receiving said first or second voltage sequence, and said first positive voltage is set at a level which is near or above the turn on threshold source potential for higher threshold cells in the high threshold state, and less than the turn on threshold source potential for lower threshold cells in the high threshold state, and the second positive potential is set at level which is near or above the turn on threshold source potential for lower threshold cells in the high threshold state, so that band-to-band maneling current is controlled in said first voltage sequence in the presence of higher threshold cells in the high threshold state, and the higher threshold cells in the high threshold state are lowered in threshold before said second voltage sequence to limit peak current consumption; and a second control circuit, coupled to the plurality of sector flags, and to the pluralities of drain lines, source lines and word lines in the plurality of sectors, and wherein said first and second voltage sequences result in some cells having thresholds lowered below a selected limit of threshold voltages, including voltage supply circuits to supply a repair pulse to the selected sectors indicated by the plurality of sector flags, during a repair time interval across the plurality of source lines and the plurality of drain lines, while setting the voltage on the plurality of word lines to a level below the selected limit.

11. The floating gate memory integrated circuit of claim 10, wherein said first positive potential is less than 5 volts, and said second positive potential is less than 7 volts.

12. The floating gate memory integrated circuit of claim 11, wherein said negative potential in said first voltage sequence is less than negative 6 volts.

13. The floating gate memory integrated circuit of claim 11, wherein said negative potentials in said first voltage sequence and in said second voltage sequence are less than negative 6 volts.

14. The floating gate memory integrated circuit of claim 10, wherein said first positive potential is between 4 and 5 volts, and said second voltage potential is between 5 and 6 volts.

15. The floating gate memory integrated circuit of claim 14, wherein said negative potentials in said first voltage sequence and in said second positive sequence are less than negative 7 volts.

16. The floating gate memory integrated circuit of claim 10, wherein said sectors in said plurality of sectors include more than 250 thousand cells.

17. The floating gate memory integrated circuit of claim 10, wherein said array of cells includes more than 4 million cells.

18. The floating gate memory integrated circuit of claim 10, wherein said first control circuit sets the plurality of drain lines to an open circuit state in said first and second voltage sequences.

19. In a floating gate memory integrated circuit, comprising an array of floating gate memory cells arranged in a plurality of rows and columns, said cells having a high threshold state in which cells are not conductive in response to a read potential applied to control gate terminals of the cells, and a low threshold state in which cells are conductive in response to a read potential applied to the control gate terminals; the array including a plurality of drain lines coupled to drain terminals of respective columns of cells, a plurality of source lines coupled to source terminals of respective columns of cells, a plurality of word lines coupled to control gate terminals of respective rows of cells, a method for setting the cells in the array in the high threshold state in parallel to the low threshold state, comprising:

supplying a first voltage sequence to lower the thresholds of cells in the array by Fowler-Nordheim tunneling, the first voltage sequence including applying a negative potential to the plurality of word lines, and applying a first positive potential to the plurality of source lines, then testing the thresholds of the cells, and if all the cells are not in the low threshold state, and if a number M of times the first voltage sequence has been tried does not equal a retry limit, then retrying the first voltage sequence and the testing until all the cells are in the low threshold state, where M is greater than or equal to one, and if any of the cells are not in the low threshold state after the number M of retries of the first voltage sequence, supplying a second voltage sequence to lower the thresholds of cells in the array by Fowler-Nordheim tunneling, the second voltage sequence including applying a negative potential to the plurality of word lines, and applying a second positive potential to the plurality of source lines, then testing the thresholds of the cells, and if all the cells are not in the low threshold state, retrying the second voltage sequence and the testing until all the cells are in the low threshold state, or at least until a number of retries has been executed;

wherein the first and second voltage sequences induce band-to-band tunneling current in addition to Fowler-Nordheim tunneling current, said band-to-band tunneling current characterized by a turn on threshold source potential which is inversely related to the threshold of the cell receiving said first or second voltage sequence, and said first positive voltage is set at a level which is near or above the turn on threshold source potential for higher threshold cells in the high threshold state, and less than the turn on threshold source potential for lower threshold cells in the high threshold state, and the second positive potential is set at level which is near or above the turn on threshold source potential for lower threshold cells in the high threshold state, so that band-to-band tunneling current is controlled in said first voltage sequence in the presence of higher threshold cells in the high threshold state, and the higher threshold cells in the high threshold state are lowered in threshold before said second voltage sequence to limit peak current consumption.

20. The method of claim 19, wherein said first positive potential is less than 5 volts, and said second positive potential is less than 7 volts.

21. The method of claim 20, wherein said negative potential in said first voltage sequence is less than negative 6 volts.

22. The method of claim 20, wherein said negative potentials in said first voltage sequence and in said second voltage sequence are less than negative 6 volts.

23. The method of claim 19, wherein said first positive potential is between 4 and 5 volts, and said second positive potential is between 5 and 6 volts.

24. The method of claim 23, wherein said negative potentials in said first voltage sequence and in said second voltage sequence are less than negative 7 volts.

25. The method of claim 19, wherein said array of cells includes more than 250 thousand cells.

26. The method of claim 19, wherein said set of cells includes more than 4 million cells.

27. The method of claim 19, including setting plurality of drain lines to an open circuit state in said first and second voltage sequences.

28. The method of claim 19, wherein said first and second voltage sequences result in some cells having thresholds lowered below a selected limit of threshold voltages, including supplying a repair pulse to the array, during a repair time interval across the plurality of source lines and the plurality of drain lines, while setting the voltage on the plurality of word lines to a level below the selected limit.

* * * * *